(12) United States Patent
Lee et al.

(10) Patent No.: US 10,607,877 B2
(45) Date of Patent: Mar. 31, 2020

(54) CHIP MOUNTING APPARATUS AND METHOD USING THE SAME

(71) Applicant: SAMSUNG ELECTRONICS CO., LTD., Suwon-si (KR)

(72) Inventors: Jin Sub Lee, Suwon-si (KR); Han Kyu Seong, Seoul (KR); Yong Il Kim, Seoul (KR); Sung Hyun Sim, Uiwang-si (KR); Dong gun Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 4 days.

(21) Appl. No.: 15/869,405

(22) Filed: Jan. 12, 2018

(65) Prior Publication Data

US 2018/0374738 A1  Dec. 27, 2018

(30) Foreign Application Priority Data

Jun. 23, 2017  (KR) .......................... 10-2017-0079749

(51) Int. Cl.
*H01L 21/68* (2006.01)
*H01L 21/683* (2006.01)
(Continued)

(52) U.S. Cl.
CPC .... *H01L 21/6835* (2013.01); *H01L 21/67092* (2013.01); *H01L 21/67115* (2013.01);
(Continued)

(58) Field of Classification Search
CPC ........... H01L 21/6835; H01L 21/67092; H01L 22/20; H01L 21/67288; H01L 21/67115;
(Continued)

(56) References Cited

U.S. PATENT DOCUMENTS 6,372,608 B1   4/2002   Shimoda et al.
6,645,830 B2   11/2003  Shimoda et al.
(Continued)

FOREIGN PATENT DOCUMENTS

JP   2000-40678 A    2/2000
JP   2002-314053 A   10/2002
JP   2002-343944 A   11/2002

*Primary Examiner* — Charles D Garber
*Assistant Examiner* — S M Sohel Imtiaz
(74) *Attorney, Agent, or Firm* — Sughrue Mion, PLLC (57) ABSTRACT

A chip mounting method includes providing a first substrate including a light transmissive substrate having first and second surfaces, a sacrificial layer provided on the first surface, and a plurality of chips bonded to the sacrificial layer, obtaining first mapping data by testing the chips, the first mapping data defining coordinates of normal chips and defective chips among the chips, disposing a second substrate below the first surface, disposing the normal chips on the second substrate by radiating a first laser beam to positions of the sacrificial layer corresponding to the coordinates of the normal chips, based on the first mapping data, to remove portions of the sacrificial layer thereby separating the normal chips from the light transmissive substrate, and mounting the normal chips on the second substrate by radiating a second laser beam to a solder layer of the second substrate.

16 Claims, 8 Drawing Sheets

(51) Int. Cl.
    *H01L 23/00*     (2006.01)
    *H01L 21/67*     (2006.01)
    *H01L 33/00*     (2010.01)
    *H01L 33/62*     (2010.01)
    *H01L 25/075*     (2006.01)
    *H01L 21/66*     (2006.01)
    *B23K 26/00*     (2014.01)

(52) U.S. Cl.
CPC .. *H01L 21/67144* (2013.01); *H01L 21/67271* (2013.01); *H01L 21/67288* (2013.01); *H01L 22/20* (2013.01); *H01L 24/81* (2013.01); *H01L 25/0753* (2013.01); *H01L 33/0079* (2013.01); *H01L 33/0095* (2013.01); *H01L 33/62* (2013.01); *B23K 26/00* (2013.01); *H01L 22/14* (2013.01); *H01L 24/16* (2013.01); *H01L 33/00* (2013.01); *H01L 2221/68322* (2013.01); *H01L 2221/68327* (2013.01); *H01L 2221/68354* (2013.01); *H01L 2221/68363* (2013.01); *H01L 2221/68381* (2013.01); *H01L 2224/16227* (2013.01); *H01L 2224/81224* (2013.01); *H01L 2224/81801* (2013.01); *H01L 2924/12041* (2013.01); *H01L 2933/0066* (2013.01)

(58) Field of Classification Search
CPC ........... H01L 33/62; H01L 2221/68327; H01L 2224/81227; H01L 2221/68381
See application file for complete search history.

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,818,531 B1 | 11/2004 | Yoo et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,141,348 B2 | 11/2006 | Sheats et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,834,359 B2 | 11/2010 | Kimura | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,070,969 B2 | 12/2011 | Silverbrook | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 2002/0028045 A1* | 3/2002 | Yoshimura | G02B 6/10 385/50 |
| 2004/0192012 A1* | 9/2004 | Takezoe | H01L 21/6835 438/460 |
| 2006/0124941 A1* | 6/2006 | Lee | H01L 33/0079 257/88 |
| 2007/0008534 A1* | 1/2007 | Lo | G11C 17/143 356/401 |
| 2008/0042153 A1* | 2/2008 | Beeson | H05B 33/10 257/94 |
| 2013/0037842 A1* | 2/2013 | Yamada | H01L 33/60 257/98 |
| 2013/0187174 A1* | 7/2013 | Tischler | H01L 27/14 257/80 |
| 2014/0319560 A1* | 10/2014 | Tischler | H01L 33/502 257/98 |
| 2015/0364639 A1* | 12/2015 | Hong | H01L 24/97 438/7 |
| 2016/0079109 A1* | 3/2016 | Shima | H01L 21/6835 438/464 |
| 2016/0079111 A1* | 3/2016 | Graf | H01L 21/2686 438/464 |
| 2016/0126224 A1* | 5/2016 | Lee | H01L 33/38 257/89 |
| 2016/0276205 A1 | 9/2016 | Huska et al. | |
| 2017/0294479 A1* | 10/2017 | Cha | H01L 25/0655 |
| 2017/0301560 A1* | 10/2017 | Yoon | H01L 24/81 |
| 2018/0277408 A1* | 9/2018 | Abbet | G01R 31/2831 |

\* cited by examiner

CHIP MOUNTING APPARATUS AND METHOD USING THE SAME

CROSS-REFERENCE TO RELATED APPLICATION

This application claims priority from Korean Patent Application No. 10-2017-0079749, filed on Jun. 23, 2017 in the Korean Intellectual Property Office, the disclosure of which is incorporated herein by reference in its entirety.

BACKGROUND

1. Field

Example embodiments of present disclosure relate to a chip mounting apparatus and method using the same.

2. Description of Related Art

As the size of chips mounted on mounting substrates has gradually decreased, surface-mount technology (SMT) methods, facilitating mass production and a high degree of integration, have been used in chip mounting processes.

As such SMT methods, methods of applying a solder paste and a flux to a mounting substrate, individually disposing chips to be mounted on the mounting substrate, dissolving the applied metal by passing the mounting substrate through reflow equipment, and cooling and curing the applied metal have primarily been used.

However, when the chip size is reduced to micro meter unit size and the number of chips to be mounted is tens of thousands to millions (for example, when forming a display using micro light emitting diodes (LEDs)), a significant amount of time is required to individually attach chips to be mounted, thereby reducing productivity in display manufacturing.

SUMMARY

One or more example embodiments provide a chip mounting apparatus that may reduce an amount of time required to mount chips, and a chip mounting method using the same.

According to an aspect of an example embodiment, a chip mounting method may include: providing a first substrate, the first substrate including a light transmissive substrate having a first surface and a second surface opposing the first surface, a sacrificial layer provided on the first surface, and a plurality of chips bonded to the sacrificial layer; disposing a second substrate below the first surface of the light transmissive substrate, the second substrate having a surface on which a solder layer provided; disposing the plurality of chips on the second substrate by radiating a first laser beam to the sacrificial layer to separate the plurality of chips from the light transmissive substrate; and mounting the plurality of chips on the second substrate by radiating a second laser beam to the solder layer.

According to an aspect of another example embodiment, a chip mounting method may include: providing a first substrate, the first substrate including a light transmissive substrate having a first surface and a second surface opposing the first surface, an ultraviolet-sensitive layer provided on the first surface, and a plurality of chips bonded to the ultraviolet-sensitive layer; obtaining mapping data by testing the plurality of chips, the mapping data indicating coordinates of normal chips and defective chips among the plurality of chips; disposing a second substrate below the first surface, the second substrate including a printed circuit on which a solder layer is provided; disposing the normal chips on the printed circuit of the second substrate by radiating a ultraviolet laser beam to portions of the ultraviolet-sensitive layer in positions of the ultraviolet-sensitive layer, to which the normal chips are bonded, based on the mapping data, to remove the portions of the ultraviolet-sensitive layer; and mounting the normal chips, disposed on the printed circuit, on the printed circuit by radiating an infrared laser beam to the solder layer.

According to an aspect of another example embodiment, a chip mounting apparatus may include: a test unit configured to generate mapping data by testing a plurality of chips bonded to a first substrate by a sacrificial layer, the mapping data indicating coordinates of normal chips and defective chips among the plurality of chips; a first laser light source unit configured radiate a first laser beam to portions of the sacrificial layer, to which the normal chips are bonded, based on the mapping data, to remove the portions of the sacrificial layer thereby separating the normal chips from the first substrate; and a second laser light source unit configured to radiate a second laser beam to a second substrate, on which the normal chips are disposed after being separated from the first substrate, to mount the normal chips on the second substrate.

BRIEF DESCRIPTION OF DRAWINGS

The above and other aspects, features, and advantages of the present disclosure will be more clearly understood from the following detailed description when taken in conjunction with the accompanying drawings, in which.

DETAILED DESCRIPTION

Hereinafter, example embodiments will be described in detail with reference to the attached drawings. FIGS. 1, 2, 3, 4A, 5, 6A, and 7A are cross-sectional views illustrating principal processes of a chip mounting method, according to an example embodiment. FIG. 4B is an example of first mapping data provided by testing a plurality of chips disposed on a wafer. FIG. 6B is an enlarged view of region A of FIG. 6A. FIG. 7B is an enlarged view of region C of FIG. 7A.

As is traditional in the field of the inventive concepts, some embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

A chip mounting method, according to an example embodiment, may include providing a first substrate, to which a plurality of chips to be mounted are bonded, testing the chips and providing first mapping data, in which coordinates of the chips are mapped, according to test results, disposing a second substrate below the first substrate, disposing the chips on the second substrate by radiating a first laser beam to the first substrate, and mounting the chips on the second substrate by radiating a second laser beam to the second substrate. Each of the chips, according to an example embodiment, may be a wafer level package (WLP). In detail, each chip may be a micro light emitting diode (LED), forming a pixel of an LED display.

Figure 1:
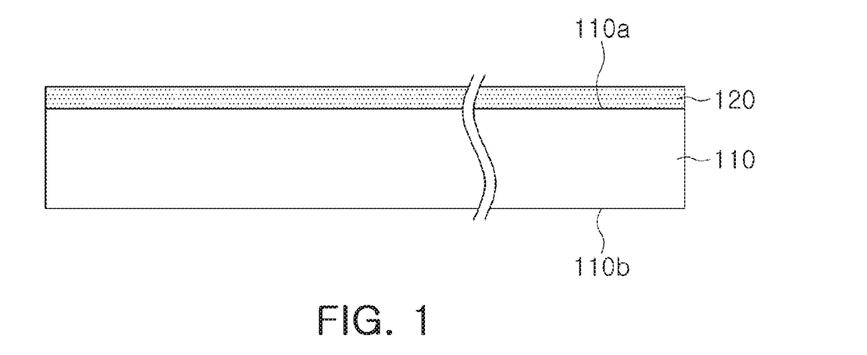
FIGS. 1, 2, 3, 4A, 5, 6A, and 7A are cross-sectional views illustrating principal processes of a chip mounting method, according to an example embodiment.

First, as illustrated in FIG. 1, a sacrificial layer 120 may be formed on a light transmissive substrate 110.

The light transmissive substrate 110 may have light transmitting properties so that a first laser beam to be described later may be transmitted through the light transmissive substrate 110, and may be formed of any material, having a hardness sufficient to firmly support the chips in a subsequent process. For example, the light transmissive substrate 110 may be formed of a material, having light transmitting properties, such as glass, quartz, sapphire, silicon carbide (SiC), or silicon (Si). However, the material of the light transmissive substrate 110 is not limited thereto. The light transmissive substrate 110 may have a plate shape, having a first surface 110a and a second surface 110b opposing the first surface 110a, and may also have a wafer shape.

The sacrificial layer 120 may have the chips bonded thereto in a subsequent process, and may be formed of a material, in which an ablation phenomenon may occur at a surface when the material absorbs a certain amount of energy. For example, the sacrificial layer 120 may be formed by spin-coating liquid polyimide on the light transmissive substrate 110. The ablation phenomenon may refer to a phenomenon in which, when a high energy wavelength beam, such as a laser beam, is radiated to a material layer, a surface of the material layer is rapidly melted and vaporized, so that a portion of the material layer may be removed. Thus, the chips may be easily separated from the sacrificial layer 120 by radiating a laser beam to the sacrificial layer 120, to which the chips are bonded, in a subsequent process. According to an example embodiment, the sacrificial layer 120 may be an ultraviolet (UV)-sensitive layer, which may be melted and vaporized when the UV-sensitive layer is irradiated with a UV laser beam.

Figure 2:
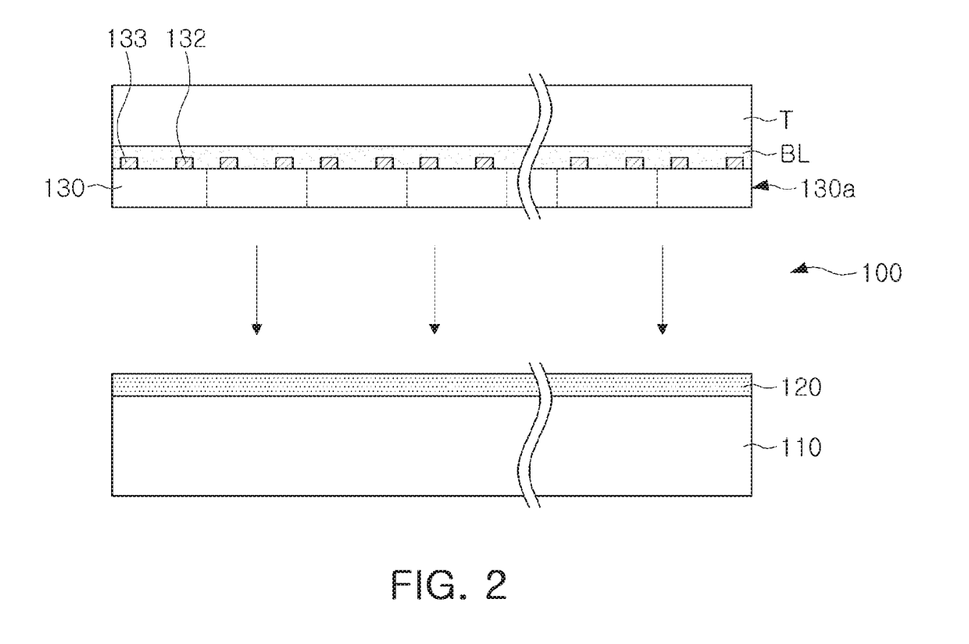

Subsequently, as illustrated in FIG. 2, a plurality of chips 130 may be bonded to the sacrificial layer 120 to provide a first substrate 100. Each of the chips 130 may be a WLP. According to an example embodiment, each chip 130 may be a microLED, forming a pixel of an LED display.

According to an example embodiment, the chips 130 may also be provided in a state of being bonded to a temporary support substrate T, using a bonding layer BL. The temporary support substrate T may support the chips 130 to prevent the chips 130 from being damaged before the chips 130 are bonded to the light transmissive substrate 110. Alternatively, according to an example embodiment, the chips 130 may also be provided in a state of not being bonded to the temporary support substrate T. The temporary support substrate T may be formed of a material, having light transmitting properties. For example, the temporary support substrate T may be formed of a material, such as glass, quartz, sapphire, SiC, or Si. However, the material of the temporary support substrate T is not limited thereto. The bonding layer BL may be a UV-sensitive film, whose adhesion may be reduced when the UV-sensitive film is irradiated with UV light. A first electrode 132 and a second electrode 133 of each of the chips 130 may be bonded to the bonding layer BL. A reduction in the adhesion of the bonding layer BL may cause the chips 130 to be separated from the bonding layer BL, and thus the first and second electrodes 132 and 133 may be exposed. The chips 130 may be bonded to the temporary support substrate T in the form of a device layer 130a, which is not divided into individual device units.

Figure 3:
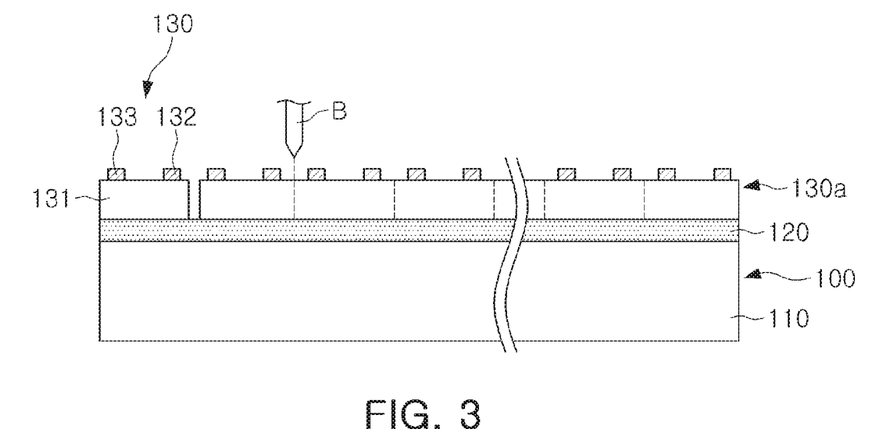

Subsequently, as illustrated in FIG. 3, a dicing process of dividing the device layer 130a into the chips 130 of individual device units by cutting the device layer 130a into units of individual package bodies 131 with a blade B, may be performed. However, embodiments are not limited to the dicing process using the blade B. Further, a method of dividing the device layer 130a into the chips 130 of individual device units by radiating a laser beam to the device layer 130a may be utilized.

Figure 4A:
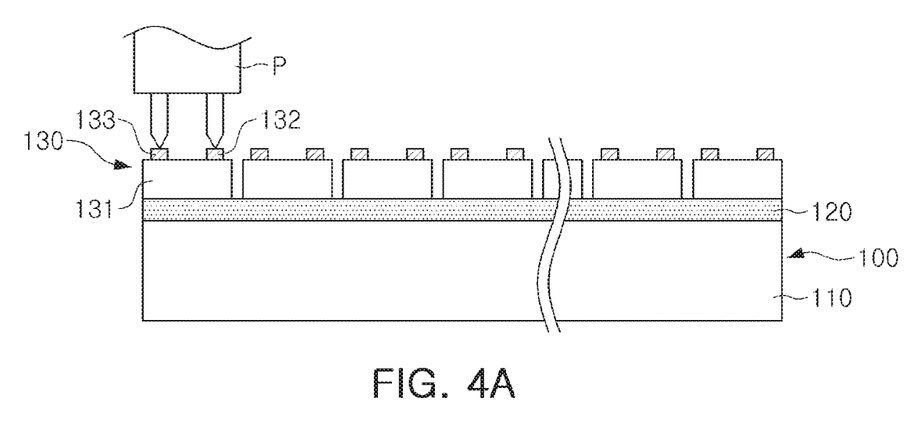
Figure 4B:
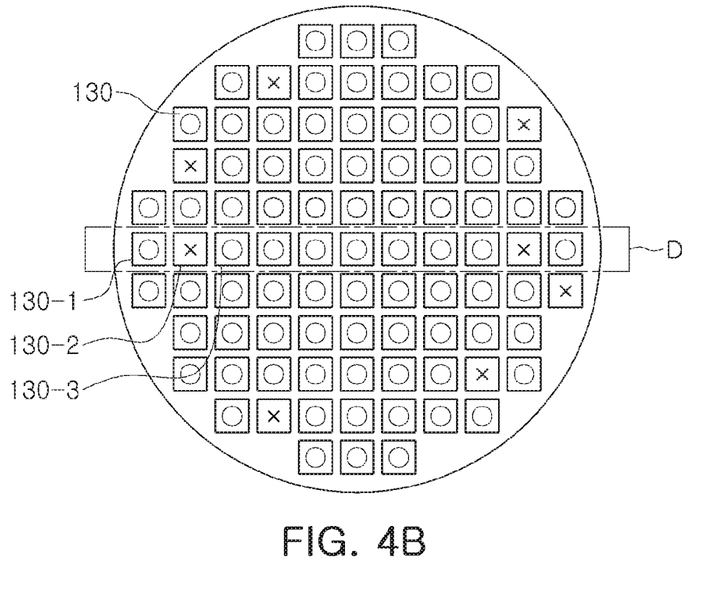
FIG. 4B is an example of first mapping data provided by testing a plurality of chips disposed on a wafer.

Subsequently, as illustrated in FIG. 4A, first mapping data may be generated by testing the diced chips 130, respectively, and may define coordinates of normally operating chips and defective chips.

Various methods able to determine normal operations of chips according to types of chip may be applied to the test for the chips 130. For example, a method of applying power to the first electrode 132 and the second electrode 133 of each of the chips 130, using a probe P, and of measuring light emitted from the first electrode 132 and the second electrode 133, may be used. However, embodiments are not limited thereto. Further, various measurement methods, such as a method of radiating a UV beam or a laser beam to a surface of each of the chips 130 and measuring light reflected from the surface, may be used. Such a test may confirm whether or not the chips 130 operate normally and may define the coordinates of the respective chips 130 to provide the first mapping data. FIG. 4B is an example of the first mapping data obtained through the process described above, and illustrates that whether or not the chips 130 operate normally is indicated by "○" or "x" in positions corresponding to the coordinates of the respective chips 130. According to an example embodiment, normally operating chips (hereinafter referred to as "normal chips") indicated by "○" and abnormally operating chips (hereinafter referred to as "defective chips") indicated by "x" are described, for example. Further, the first mapping data of the chips 130 may be, for example, data of Group D. For example, described is Group D in a case in which chips 130-1, 130-2, and 130-3 of Group D, sequentially disposed from the leftward side on the first substrate 100, correspond to a normal chip, a defective chip, and a normal chip, respectively.

Figure 5:
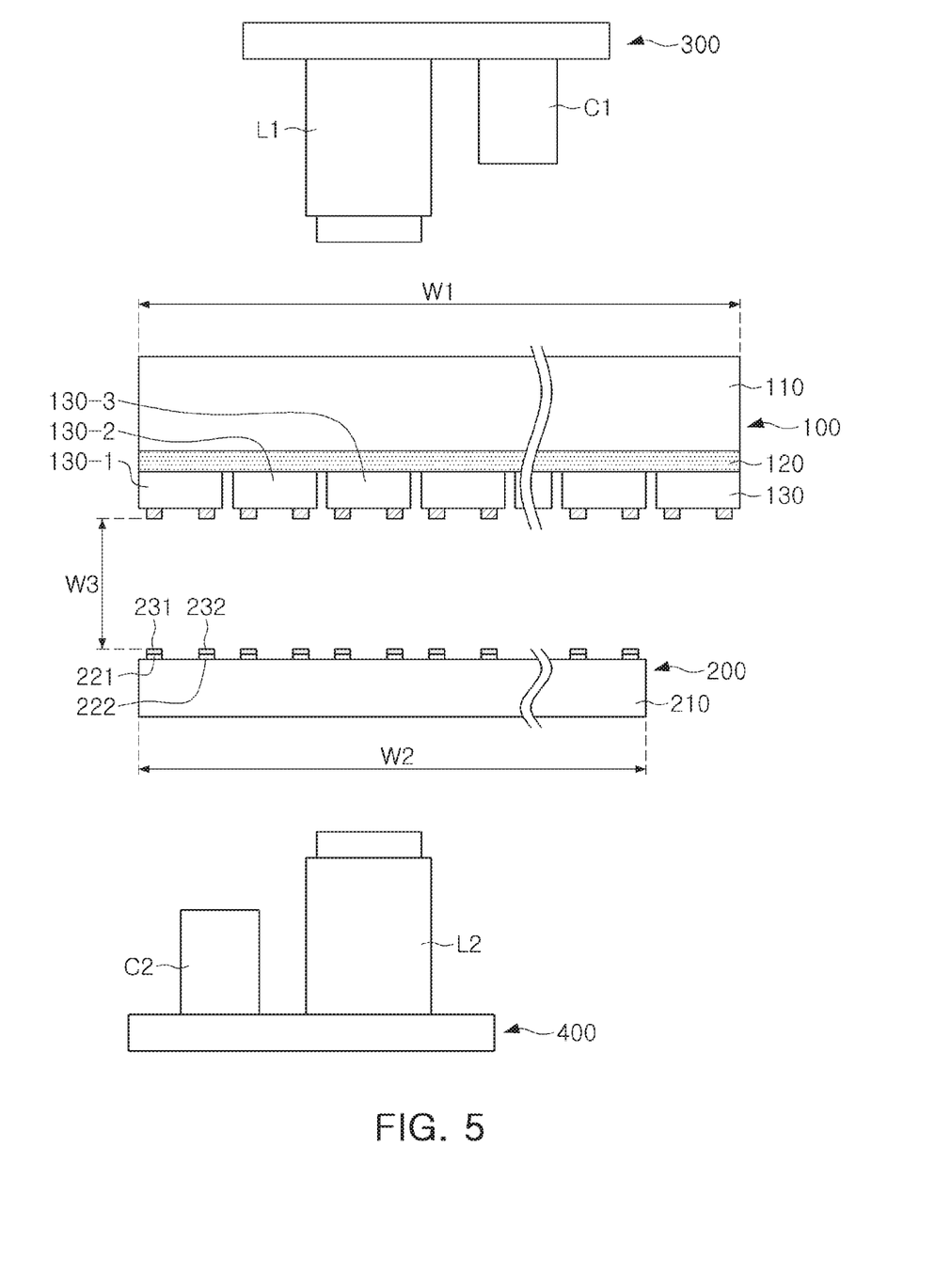

Subsequently, as illustrated in FIG. 5, the first substrate 100 may be inverted, such that the chips 130 may be disposed on a lower surface of the first substrate 100, and a second substrate 200 may be disposed below the first substrate 100.

The second substrate 200 may be a mounting substrate, on which the chips 130 are mounted, in a subsequent process, and may have a surface, on which printed circuits 221 and 222 having the chips 130 mounted thereon are disposed. The second substrate 200 may be provided as a substrate, such as a printed circuit board (PCB), a metal core printed circuit board (MCPCB), a metal printed circuit board (MPCB), or a flexible printed circuit board (FPCB), and a structure of the mounting substrate may be applied in various forms. Surfaces of the printed circuits 221 and 222, contacting the chips 130, may be coated with solder layers 231 and 232, respectively. When the solder layers 231 and 232 are heated by being irradiated with a second laser beam in a subsequent process, the solder layers 231 and 232 may be melted, and the chips 130 may be mounted on the printed circuits 221 and 222. According to an example embodiment, each of the solder layers 231 and 232 may be formed of a solder paste. According to an example embodiment, the second substrate 200 may be a unit module substrate of the LED display. A width W2 of the second substrate 200 may be different from a width W1 of the first substrate 100. For example, the first substrate 100 may be a wafer, having a width of 8 inches, and the second substrate 200 may be a unit module substrate, having a width of several centimeters.

Further, the first substrate 100 and the second substrate 200 may face each other with a predetermined interval W3 therebetween. The predetermined interval W3 may be about 100 um to about 1 mm. When the predetermined interval W3 is less than 100 um, a space between the first substrate 100 and the second substrate 200 may be extremely narrow, and a chip 130 dropping from the first substrate 100 may be rebonded to the first substrate 100. When the predetermined interval W3 exceeds 1 mm, a chip 130 dropping from the first substrate 100 may be highly likely to be misaligned on the printed circuits 221 and 222, due to a falling speed thereof.

Further, a first laser light source unit 300 may be disposed above the first substrate 100, and may oscillate the first laser beam to the chips 130, and a second laser light source unit 400 may be disposed below the second substrate 200 to mount the chips 130 on the second substrate 200. The first laser light source unit 300 and the second laser light source unit 400 may include a first camera C1 and a second camera C2, respectively, which may identify positions of the chips 130 and confirm an alignment status thereof.

Figure 6A:
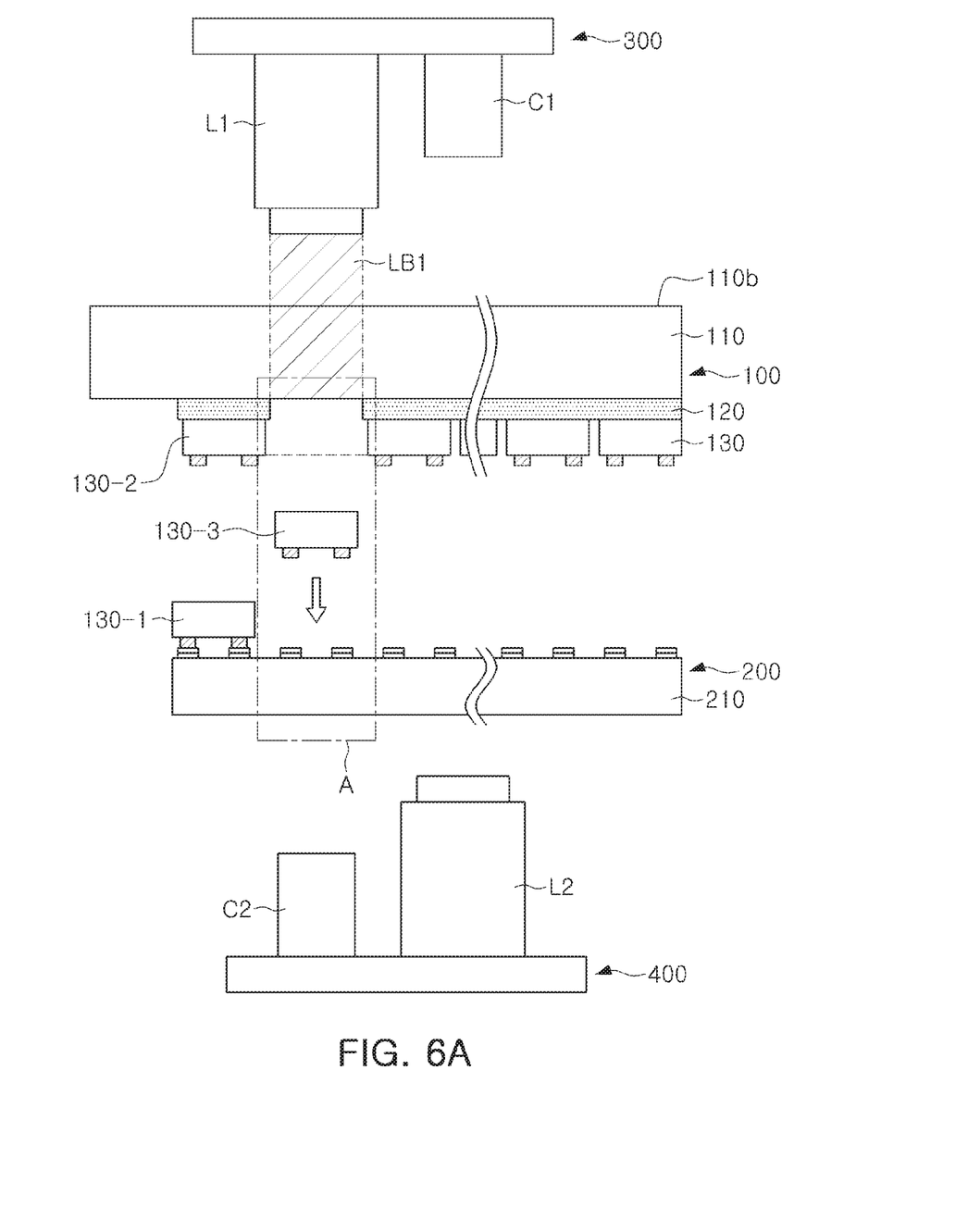
Figure 6B:
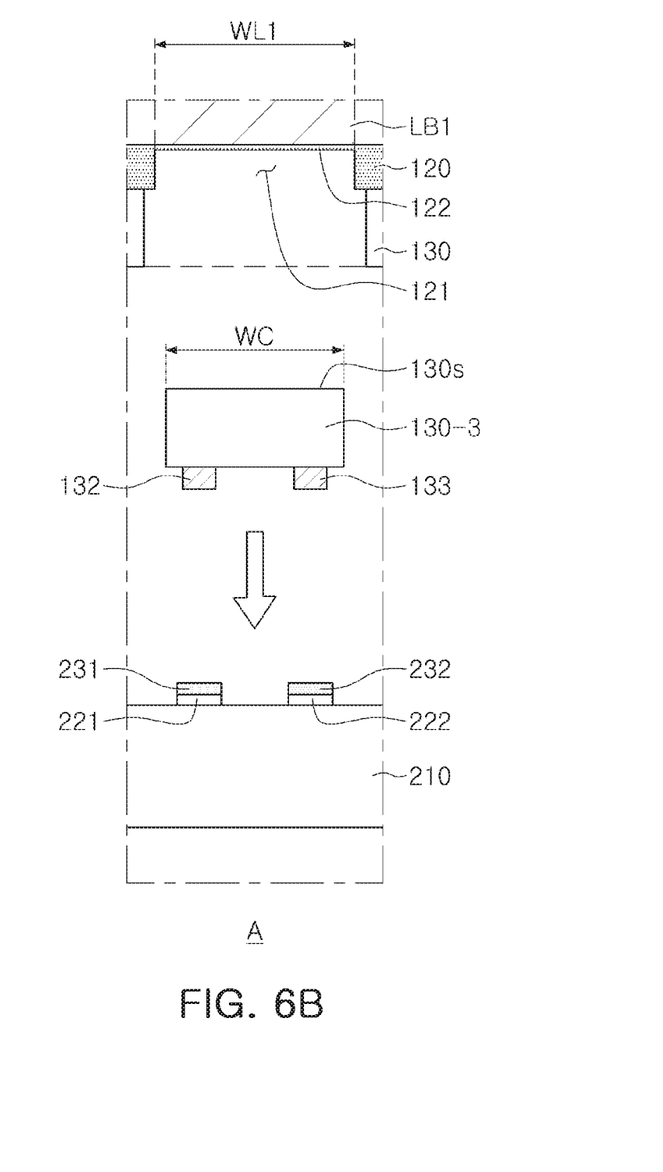
FIG. 6B is an enlarged view of region A of FIG. 6A.

Subsequently, as illustrated in FIGS. 6A and 6B, a first laser beam LB1 may be radiated to the sacrificial layer 120, based on the first mapping data, to separate the chips 130 from the first substrate 100. Thus, the chips 130 may be disposed on the second substrate 200.

The first laser light source unit 300 may include a first laser light source L1, oscillating the first laser beam LB1. Further, the first laser light source unit 300 may include the first camera C1 which operates as an optical device scanning a location of the first substrate 100 to which the first laser beam LB1 is to be radiated.

The first laser beam LB1 may be radiated to the sacrificial layer 120 through the second surface 110b of the light transmissive substrate 110. The first laser beam LB1 may be a UV laser beam, having high energy, sufficient to cause the ablation phenomenon at a surface of the sacrificial layer 120. The first laser light source L1 may be a UV laser light source that is able to radiate such a UV laser beam. The first laser beam LB1 may have a first energy that is higher than a second energy of the second laser beam to be described later. The first laser beam LB1 may have a first beam width WL1 that is the same as a width WC (refer to FIG. 6B) of the chip, so that the first laser beam LB1 may be selectively radiated to only the coordinates of the first mapping data defined as the normal chips. For this purpose, the first laser light source L1 may radiate the first laser beam LB1, having a beam profile of a quadrangular shape, for example, a top-hat shape, similar to a shape of an upper surface 130s of the chip 130-3. When the first laser beam LB1 is radiated to the surface of the sacrificial layer 120, the ablation phenomenon may occur at a portion of the sacrificial layer 120 irradiated with the first laser beam LB1, and the portion of the sacrificial layer 120 may thus be rapidly melted and vaporized to be removed. Thus, the portion of the sacrificial layer 120 may be removed to form a groove portion 121, and the chip 130-3 may be separated from the first substrate 100 to drop in a direction toward the second substrate 200. An unremoved remainder 122 of the sacrificial layer 120 may be present on a lower surface of the groove portion 121.

Thus, the first laser light source unit 300 may radiate the first laser beam LB1 to the first substrate 100 in individual chip units, so that the normal chips, except for the defective chips, may be selectively separated from the first substrate 100, respectively. Further, the first laser beam LB1 may be radiated to the first substrate 100 in chip size units, so as to eliminate a need for an additional mask layer limiting a portion of the first substrate 100, irradiated with the first laser beam LB1, to the individual chip units, thus simplifying a manufacturing process. As a result, a time required to mount the chips 130 and manufacturing costs may be significantly reduced.

FIG. 6A illustrates the third chip 130-3 from the leftward side on the first substrate 100, which is irradiated with the first laser beam LB1, such that the chip 130-3 drops to and is deposited on the second substrate 200. As illustrated in FIG. 6A, the normal chip 130-1 may be disposed on the second substrate 200, and the defective chip 130-2 may remain on the first substrate 100.

After separating the normal chips 130 from the first substrate 100 and disposing the normal chips 130 on the second substrate 200, an operation of determining whether the chips 130 are normally/properly arranged on the printed circuits 221 and 222 through the second camera C2 and storing an alignment status as second mapping data may be further performed. In addition, an operation of removing abnormally arranged or misaligned chips from the printed circuits 221 and 222 and additionally arranging normal chips on the printed circuits 221 and 222, based on the second mapping data indicating coordinates of misaligned chips, may be further performed. The operation of additionally arranging chips on the printed circuits 221 and 222 may include additionally arranging separately provided normal chips on the printed circuits 221 and 222, and may further include additionally disposing normal chips on the second substrate 200 by dropping the normal chips, disposed on the first substrate 100.

Figure 7A:
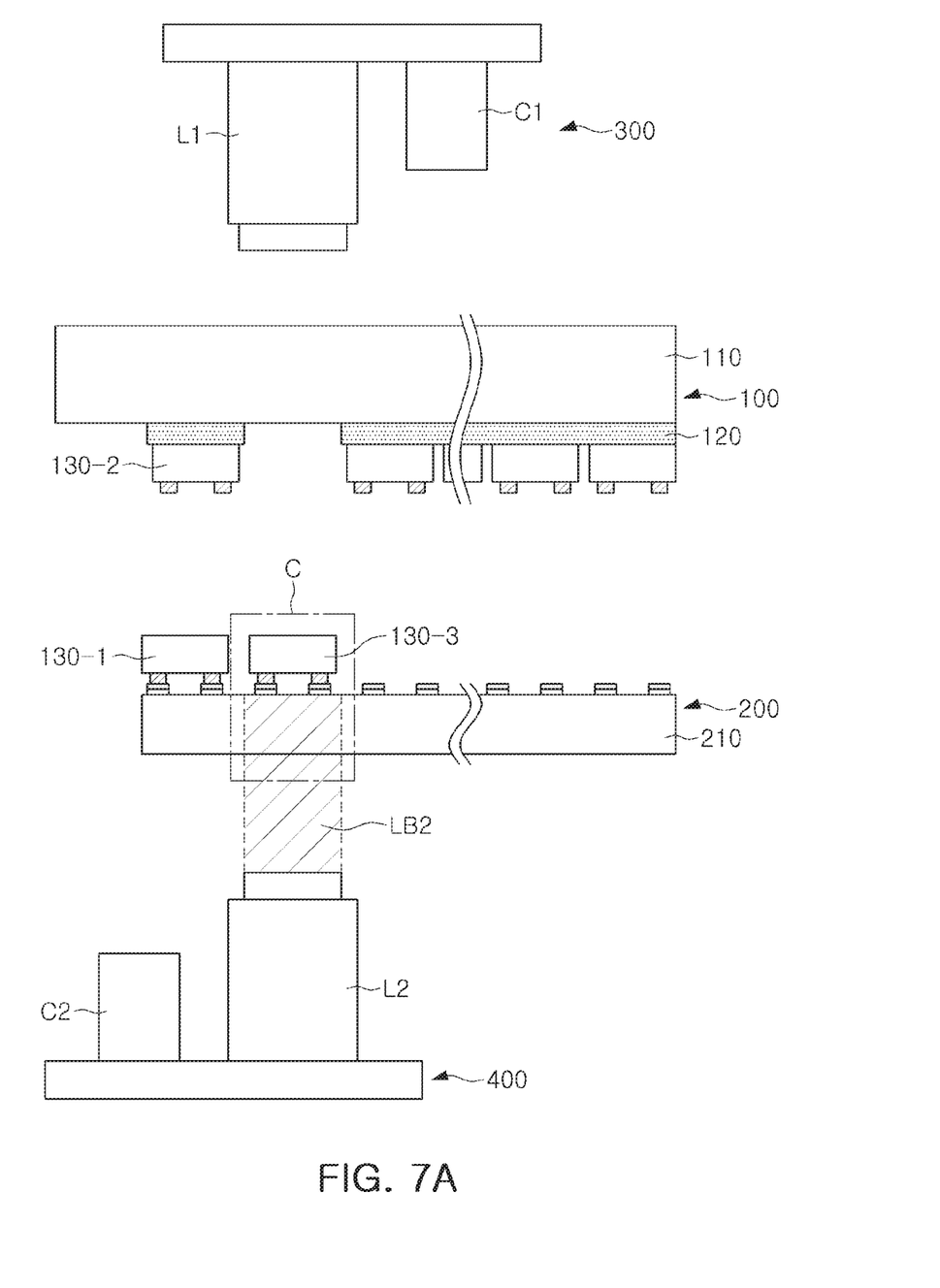
Figure 7B:
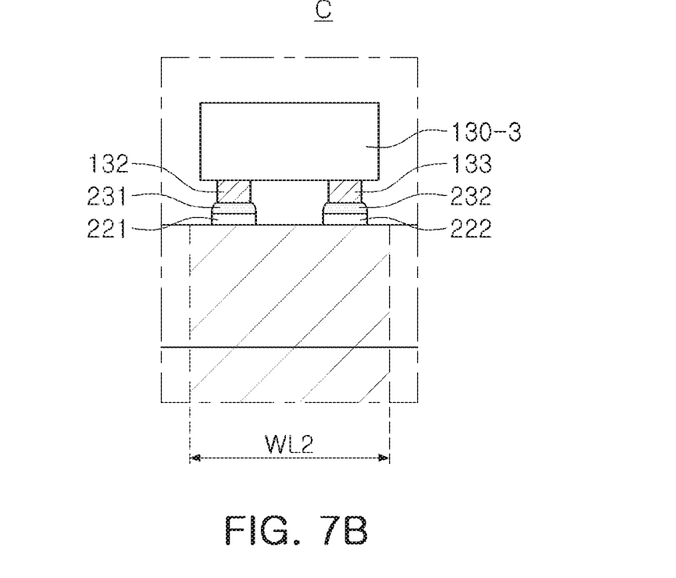
FIG. 7B is an enlarged view of region C of FIG. 7A.

Subsequently, as illustrated in FIGS. 7A and 7B, a second laser beam LB2 may be radiated to the solder layers 231 and 232 coated on the printed circuits 221 and 222 of the second substrate 200 to heat the solder pastes of the solder layers 231 and 232. Thus, the first and second electrodes 132 and 133 of the chip 130-3 may be bonded to the printed circuits 221 and 222. A second laser light source L2 of the second laser light source unit 400 may oscillate a second laser beam LB2, and may be a light source, oscillating a laser beam having an energy level lower than that of a laser beam oscillated by the first laser light source L1. According to an example embodiment, the second laser light source L2 may be an IR laser light source, oscillating an IR laser beam having an energy level lower than that of a UV laser beam.

The second camera C2 may be used to scan a location to which the second laser beam LB2 is radiated. FIG. 7A illustrates the second laser beam LB2 radiated from below the second substrate 200. However, embodiments are not limited thereto. The second laser beam LB2 may be radiated from above the first substrate 100 (i.e., radiated to a third surface of the second substrate opposing a fourth surface of the second substrate on which the normal chips are mounted), or may be obliquely radiated between the first substrate 100 and the second substrate 200. Energy of the second laser beam LB2 may be lower than that of the first laser beam LB1 that removes the sacrificial layer 120. Thus, even in the case that the second laser beam LB2 is radiated from above the first substrate 100, the solder layers 231 and 232 may be heated without damage to the sacrificial layer 120.

A second beam width WL2 of the second laser beam LB2 may be a size that includes contact portions between the first and second electrodes 132 and 133 of the chip 130-3 to be mounted and the solder layers 231 and 232. However, the second laser beam LB2 is not limited to being radiated to have a beam width corresponding to a single chip 130-3. The second laser beam LB2 may also be radiated to the second substrate 200 to have a width corresponding to a plurality of chips. Thus, whenever a single chip is separated from the first substrate 100, the second laser beam LB2 may be radiated to the second substrate 200, and, after a plurality of chips are separated from the first substrate 100, the chips may also be mounted on the second substrate 200 in group units in order to radiate the second laser beam LB2, having a beam width sufficient to mount all of the chips on the second substrate 200 simultaneously, to the second substrate 200.

Figure 8:
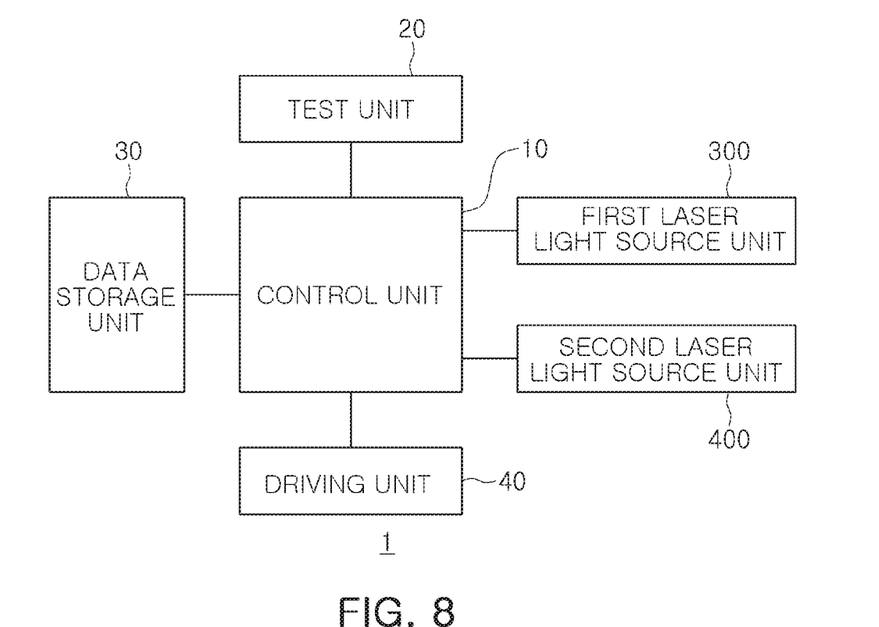
FIG. 8 is a block diagram of a chip mounting apparatus, according to an example embodiment.

Referring to FIG. 8, a chip mounting apparatus 1, according to an example embodiment, is described. FIG. 8 is a block diagram of the chip mounting apparatus 1 according to an example embodiment.

The chip mounting apparatus 1, according to an example embodiment, may include a test unit 20, a first laser light source unit 300, and a second laser light source unit 400. The chip mounting apparatus 1 may further include a control unit 10, a data storage unit 30 storing data, and a driving unit 40. Detailed configurations of the first and second laser light source units 300 and 400 are described with reference to FIG. 5.

The control unit 10 may control the test unit 20 and the first and second laser light source units 300 and 400, store first and second mapping data, output from the test unit 20, in the data storage unit 30, or read the stored first and second mapping data from the data storage unit 30.

The test unit 20 may test a plurality of chips 130 disposed on a first substrate 100, generate the first mapping data defining coordinates of normal chips and defective chips, and transmit the first mapping data to the control unit 10.

The control unit 10 and the test unit 20 may be implemented, for example, by one or more processors which execute software.

The data storage unit 30 may be a storage device that stores the first and second mapping data, and may be various types of storage media, such as a hard disk drive (HDD) and/or a flash memory.

The first laser light source unit 300 may radiate a first laser beam LB1 to a sacrificial layer 120 of the first substrate 100 to separate the chips 130 from the first substrate 100. The first laser light source unit 300 may include a light source, oscillating light having a high energy wavelength sufficient to cause an ablation phenomenon at a surface of the sacrificial layer 120. According to an example embodiment, the first laser light source unit 300 may include a UV laser light source able to cause the ablation phenomenon at the surface of the sacrificial layer 120 formed of polyimide. The first laser light source unit 300 may include a first camera C1, an optical device scanning a location to which the first laser beam LB1 is to be radiated.

The second laser light source unit 400 may include a light source configured to radiate or oscillate light having an energy wavelength sufficient to heat solder layers 231 and 232, coated on printed circuits 221 and 222 disposed on the second substrate 200, to mount the chips, separated from the first substrate 100, on the printed circuits 221 and 222. The light source of the second laser light source unit 400 may be configured to oscillate light having an energy wavelength not able to damage the chips while providing sufficient energy to heat the solder layers 231 and 232. Thus, the light source of the second laser light source unit 400 may oscillate light having a wavelength of a second energy level that is lower than a first energy level of a wavelength of light oscillated by the first laser light source unit 300. According to an example embodiment, the second laser light source L2 may include an IR laser light source configured to oscillate an IR laser beam having an energy level lower than that of a UV laser beam. The second laser light source unit 400 may include a second camera C2 that operates as an optical device scanning an alignment status of the chips 130 disposed on the second substrate 200 and generating the second mapping data.

The driving unit 40 may include a driving device configured to move the first laser light source unit 300 and the second laser light source unit 400, and may further include a driving device configured to move the first substrate 100 and the second substrate 200, by control of the control unit 10.

As set forth above, according to example embodiments, a chip mounting apparatus and method using the same may directly mount chips, disposed on a wafer, on a mounting substrate, thus reducing a time required to mount the chips.

While example embodiments have been shown and described above, it will be apparent to those skilled in the art that modifications and variations could be made without departing from the scope of the present inventive concept, as defined by the appended claims.

What is claimed is:

1. A chip mounting method comprising:
providing a first substrate, the first substrate comprising a light transmissive substrate having a first surface and a second surface opposing the first surface, a sacrificial layer provided on the first surface, and a plurality of chips bonded to the sacrificial layer;
disposing a second substrate below the first surface of the light transmissive substrate, the second substrate having a surface on which a solder layer provided, and the solder layer being physically separated from the plurality of chips;
disposing the plurality of chips on the second substrate by radiating a first laser beam to the sacrificial layer to separate the plurality of chips from the light transmissive substrate; and
mounting the plurality of chips on the second substrate by radiating a second laser beam to the solder layer, wherein the first laser beam has a first energy that is higher than a second energy of the second laser beam.

2. The chip mounting method of claim 1, further comprising obtaining first mapping data by testing the plurality of chips, the first mapping data indicating coordinates of normal chips and defective chips among the plurality of chips,
wherein the disposing the plurality of chips on the second substrate comprises disposing the normal chips on the second substrate by radiating the first laser beam to positions of the sacrificial layer corresponding to the coordinates of the normal chips, based on the first mapping data, to remove portions of the sacrificial layer thereby separating the normal chips from the light transmissive substrate, and
wherein the mounting the plurality of chips comprises mounting the normal chips on the second substrate by radiating the second laser beam to the solder layer.

3. The chip mounting method of claim 2, wherein the first laser beam is an ultraviolet laser beam, and the second laser beam is an infrared laser beam.

4. The chip mounting method of claim 2, wherein the first laser beam has a beam width corresponding to a width of one among the plurality of chips, and has a beam profile having a top-hat shape.

5. The chip mounting method of claim 2, wherein the disposing the normal chips on the second substrate comprises dropping the normal chips in a direction toward the second substrate by removing the portions of the sacrificial layer irradiated with the first laser beam through vaporization.

6. The chip mounting method of claim 2, wherein the first laser beam is radiated to the second surface of the light transmissive substrate, and the second laser beam is radiated to a third surface of the second substrate opposing a fourth surface of the second substrate on which the normal chips are mounted.

7. The chip mounting method of claim 2, wherein the first laser beam and the second laser beam are radiated to the second surface of the light transmissive substrate.

8. The chip mounting method of claim 2, wherein a second beam width of the second laser beam is greater than a first beam width of the first laser beam.

9. The chip mounting method of claim 2, wherein a second beam width of the second laser beam corresponds to a width of a group of at least two chips among the plurality of chips.

10. The chip mounting method of claim 2, further comprising prior to the radiating the second laser beam, generating second mapping data by determining an alignment status of the normal chips disposed on the second substrate, the second mapping data indicating coordinates of misaligned chips.

11. The chip mounting method of claim 10, further comprising:
removing the misaligned chips having the coordinates indicated by the second mapping data; and
additionally disposing the normal chips on the second substrate.

12. The chip mounting method of claim 2, wherein the first laser beam is radiated to the sacrificial layer in units of an individual area of each of the normal chips.

13. The chip mounting method of claim 1, wherein the disposing the plurality of chips on the second substrate comprises dropping the plurality of chips in a direction toward the second substrate.

14. A chip mounting method comprising:
providing a first substrate, the first substrate comprising a light transmissive substrate having a first surface and a second surface opposing the first surface, an ultraviolet-sensitive layer provided on the first surface, and a plurality of chips bonded to the ultraviolet-sensitive layer;
obtaining mapping data by testing the plurality of chips, the mapping data indicating coordinates of normal chips and defective chips among the plurality of chips;
disposing a second substrate below the first surface, the second substrate including a printed circuit on which a solder layer is provided, and the solder layer being physically separated from the plurality of chips;
disposing the normal chips on the printed circuit of the second substrate by radiating a ultraviolet laser beam to portions of the ultraviolet-sensitive layer in positions of the ultraviolet-sensitive layer, to which the normal chips are bonded, based on the mapping data, to remove the portions of the ultraviolet-sensitive layer; and
mounting the normal chips on the printed circuit by radiating an infrared laser beam to the solder layer,
wherein the first substrate and the second substrate face each other at a predetermined interval.

15. The chip mounting method of claim 14, wherein each of the plurality of chips comprises a first electrode and a second electrode facing the second substrate, and the first electrode and the second electrode are in contact with the solder layer.

16. A chip mounting method comprising:
providing a first substrate, the first substrate comprising a light transmissive substrate having a first surface and a second surface opposing the first surface, a sacrificial layer provided on the first surface, and a plurality of chips bonded to the sacrificial layer;
disposing a second substrate below the first surface of the light transmissive substrate, the second substrate having a surface on which a solder layer provided;
disposing the plurality of chips on the second substrate by radiating a first laser beam to the sacrificial layer to separate the plurality of chips from the light transmissive substrate; and
mounting the plurality of chips on the second substrate by radiating a second laser beam to the solder layer,
wherein the first laser beam has a first energy that is higher than a second energy of the second laser beam.

* * * * *